United States Patent
Jin et al.

(10) Patent No.: US 12,317,636 B2
(45) Date of Patent: *May 27, 2025

(54) SOLAR CELL AND PHOTOVOLTAIC MODULE

(71) Applicants: ZHEJIANG JINKO SOLAR CO., LTD., Zhejiang (CN); JINKO SOLAR CO., LTD., Jiangxi (CN)

(72) Inventors: Jingsheng Jin, Zhejiang (CN); Xinyu Zhang, Zhejiang (CN); Nannan Yang, Zhejiang (CN); Bike Zhang, Zhejiang (CN); Lin'an Zhang, Zhejiang (CN); Guangming Liao, Zhejiang (CN)

(73) Assignees: ZHEJIANG JINKO SOLAR CO., LTD., Zhejiang (CN); JINKO SOLAR CO., LTD., Jiangxi (CN)

( * ) Notice: Subject to any disclaimer, the term of this patent is extended or adjusted under 35 U.S.C. 154(b) by 132 days.

This patent is subject to a terminal disclaimer.

(21) Appl. No.: 18/313,296

(22) Filed: May 5, 2023

(65) Prior Publication Data

US 2023/0275163 A1   Aug. 31, 2023

Related U.S. Application Data

(63) Continuation of application No. 17/666,532, filed on Feb. 7, 2022, now Pat. No. 11,735,675.

(30) Foreign Application Priority Data

Dec. 9, 2021   (CN) .......................... 202111501018.6

(51) Int. Cl.
*H10F 77/30*   (2025.01)
*H10F 19/80*   (2025.01)
(Continued)

(52) U.S. Cl.
CPC ........... *H10F 77/311* (2025.01); *H10F 19/80* (2025.01); *H10F 71/00* (2025.01); *H10F 77/211* (2025.01); *H10F 77/703* (2025.01)

(58) Field of Classification Search
None
See application file for complete search history.

(56) References Cited

U.S. PATENT DOCUMENTS 6,114,046  A   9/2000  Hanoka
9,871,146  B2  1/2018  Shim et al.
(Continued)

FOREIGN PATENT DOCUMENTS

CN   108447918 A   8/2018
CN   208889671 U   5/2019
(Continued)

OTHER PUBLICATIONS

Zhejiang Jinko Solar Co., Ltd., et al., AU Firs Office Action, AU 2022200624, Jan. 24, 2023, 6 pgs.
(Continued)

*Primary Examiner* — Tamir Ayad
(74) *Attorney, Agent, or Firm* — USCH Law, PC

(57) ABSTRACT

A solar cell and a photovoltaic module are disclosed, including: a substrate; a tunneling dielectric layer and a doped conductive layer disposed on the substrate, the tunneling dielectric layer being disposed between the doped conductive layer and a surface of the substrate, the doped conductive layer having a N-type or P-type doping element and having a plurality of first heavily doped regions spaced apart from each other and extending in a first direction, a doping concentration in the first heavily doped regions being greater than that in other regions of the doped conductive layer; a passivation layer disposed on a surface of the doped conductive layer facing away from the substrate; and a plurality
(Continued)

of electrodes spaced apart from each other, extending in a second direction and penetrating the passivation layer to contact the doped conductive layer, at least two first heavily doped regions contacting a same electrode.

19 Claims, 8 Drawing Sheets

(51) Int. Cl.
  *H10F 71/00*   (2025.01)
  *H10F 77/20*   (2025.01)
  *H10F 77/70*   (2025.01)

(56) References Cited

U.S. PATENT DOCUMENTS

| | | | |
|---|---|---|---|
| 2013/0061926 | A1 | 3/2013 | Komoda et al. |
| 2013/0269771 | A1 | 10/2013 | Cheun et al. |
| 2014/0096820 | A1 | 4/2014 | Neumayer et al. |
| 2015/0171230 | A1 | 6/2015 | Kapur et al. |
| 2016/0027951 | A1 | 1/2016 | Shim et al. |
| 2016/0126394 | A1 | 5/2016 | Romijn et al. |
| 2017/0213921 | A1 | 7/2017 | Yang et al. |

FOREIGN PATENT DOCUMENTS

| | | | |
|---|---|---|---|
| CN | 209471975 | U | 10/2019 |
| CN | 210926046 | U | 7/2020 |
| CN | 111613678 | A | 9/2020 |
| CN | 111613687 | A | 9/2020 |
| CN | 112542521 | A | 3/2021 |
| EP | 2595194 | A2 | 5/2013 |
| JP | 2005123447 | A | 5/2005 |
| JP | 2009021541 | A | 1/2009 |
| JP | 5019397 | B2 | 9/2012 |
| JP | 2013524514 | A | 6/2013 |
| JP | 2015122435 | A | 7/2015 |
| JP | 2015207598 | A | 11/2015 |
| JP | 2016111357 | A | 6/2016 |
| JP | 2017017323 | A | 1/2017 |
| KR | 20180050171 | A | 5/2018 |
| WO | 2011162203 | A1 | 12/2011 |
| WO | 2013161023 | A1 | 10/2013 |
| WO | 2014117216 | A1 | 8/2014 |
| WO | 2017163498 | A1 | 9/2017 |

OTHER PUBLICATIONS

Zhejiang Jinko Solar Co., Ltd et al., Non-Final Rejection, U.S. Appl. No. 17/666,532, Oct. 14, 2022, 11 pgs.
Zhejiang Jinko Solar Co., Ltd et al., Final-Rejection, U.S. Appl. No. 17/666,532, Jan. 19, 2023, 20 pgs.
Zhejiang Jinko Solar Co., Ltd., et al., Extended European Search Report, EP 22154029.7, Jun. 30, 2022, 11 pgs.
Zhejiang Jinko Solar Co., Ltd., et al., JP First Office Action with English translation, JP2022-007484, Mar. 2, 2022, 12 pgs.
Zhejiang Jinko Solar Co., Ltd., et al., JP Decision of Refusal with English translation, JP2022-007484, Jun. 9, 2022, 10 pgs.
Zhejiang Jinko Solar Co., Ltd., et al., JP Decision to Grant with English translation, JP2022-007484, Oct. 24, 2022, 5 pgs.

SOLAR CELL AND PHOTOVOLTAIC MODULE

CROSS-REFERENCE TO RELATED APPLICATION

The application is a continuation of U.S. patent application Ser. No. 17/666,532, filed on Feb. 7, 2022, which claims priority to Chinese Patent Application No. 202111501018.6, filed on Dec. 9, 2021, the content of which is incorporated herein by reference in its entirety.

TECHNICAL FIELD

Embodiments of the present disclosure relate to the field of solar cell, in particular to a solar cell and a photovoltaic module.

BACKGROUND

The performance of a solar cell (for example, photoelectric conversion efficiency) is subject to optical and electrical losses. The optical loss may be resulted from, for example, reflection of a front surface of the cell, shadows of grid lines, non-absorption of a long-wave band, and the like. The electrical loss may be resulted from, for example, photo-generated carrier recombination on a surface of a semiconductor and inside the semiconductor, contact resistance between the semiconductor and metal grid lines, contact resistance between a metal and the semiconductor, and the like.

In order to reduce the electrical loss of the solar cell, a tunneling oxide structure for passivating metal contacts may be formed on a surface of the cell. The tunneling oxide structure includes an ultra-thin tunneling dielectric layer and a doped conductive layer. The structure can provide good surface passivation, thereby reducing composite current caused by metal contact and increasing the open-circuit voltage and short-circuit current of the cell. Though the tunneling oxide structure can optimize the performance of the solar cell, there are still many factors affecting the performance of the solar cell of this type. Thus, it is of great significance to develop solar cells highly efficient in passivating contacts.

SUMMARY

Embodiments of the present disclosure provide a solar cell and a photovoltaic module, which are conducive to improving photoelectric conversion efficiency of a solar cell with passivating contacts.

In an aspect, embodiments of the present disclosure provide a solar cell including a substrate, a tunneling dielectric layer, a doped conductive layer, a passivation layer, and a plurality of electrodes. The tunneling dielectric layer and the doped conductive layer disposed on the substrate. The tunneling dielectric layer is disposed between the doped conductive layer and a surface of the substrate. The doped conductive layer has a doping element of an N type or a P type. The doped conductive layer has a plurality of first heavily doped regions spaced apart from each other and extending in a first direction. A doping concentration in the plurality of first heavily doped regions is greater than a doping concentration in other regions of the doped conductive layer. The passivation layer disposed on a surface of the doped conductive layer facing away from the substrate. The plurality of electrodes spaced apart from each other and extending in a second direction. The plurality of electrodes penetrate the passivation layer to contact the doped conductive layer, and at least two of the plurality of first heavily doped regions are in contact with a same electrode.

In an embodiment, the plurality of first heavily doped regions have a depth in a direction perpendicular to the surface of the substrate that is smaller than or equal to a thickness of the doped conductive layer in a direction perpendicular to the surface of the substrate.

In an embodiment, a ratio of the depth of the plurality of first heavily doped regions to the thickness of the doped conductive layer is in a range of 80% to 100%.

In an embodiment, the thickness of the doped conductive layer is in a range of 40 nm to 150 nm.

In an embodiment, the substrate has a plurality of second heavily doped regions. A doping concentration in the plurality of second heavily doped regions is greater than a doping concentration in other regions of the substrate. Each of the plurality of second heavily doped regions is aligned with a respective one of the plurality of first heavily doped regions. The plurality of first heavily doped regions and the plurality of second heavily doped regions have doping elements of a same type.

In an embodiment, the doping concentration in the plurality of second heavily doped regions is less than or equal to the doping concentration in the plurality of first heavily doped regions.

In an embodiment, the doping concentration of the plurality of first heavily doped regions is in a range of $2E+20$ $cm^{-3}$ to $1E+22$ $cm^{-3}$.

In an embodiment, the plurality of second heavily doped regions have a depth in a range of 0.001 μm to 1 μm in a direction perpendicular to the surface of the substrate.

In an embodiment, the tunneling dielectric layer has a plurality of third heavily doped regions extending through the tunneling dielectric layer along a thickness direction thereof to contact the plurality of first heavily doped regions and the plurality of second heavily doped regions, respectively. Each of the plurality of third heavily doped regions is aligned with a respective one of the plurality of first heavily doped regions. The plurality of first heavily doped regions and the plurality of third heavily doped regions have doping elements of a same type.

In an embodiment, in a direction along which the plurality of first heavily doped regions are distributed, each of the plurality of first heavily doped regions has a width smaller than a width of a respective one of the plurality of second heavily doped regions, and smaller than or equal to a width of a respective one of the plurality of third heavily doped regions.

In an embodiment, a ratio of a sum of surface areas of the plurality of first heavily doped regions to a surface area of the doped conductive layer is in a range of 1% to 20%.

In an embodiment, each of the plurality of first heavily doped regions has a width in a range of 20 μm to 100 μm in a direction along which the plurality of first heavily doped regions are distributed.

In an embodiment, the plurality of first heavily doped regions are spaced apart from each other with a distance in a range of 0.8 mm to 4 mm in a direction along which the plurality of first heavily doped regions are distributed.

In an embodiment, the doped conductive layer includes at least one of a polysilicon layer, an amorphous silicon layer and a microcrystalline silicon layer.

In an embodiment, the substrate has a first surface and a second surface opposing to each other. The tunneling dielectric layer and the doped conductive layer are disposed on at least one of the first surface and the second surface of the substrate.

In an embodiment, the substrate and the doped conductive layer have doping elements of a same type.

In another aspect, embodiments of the present disclosure provide a photovoltaic module including a cell string, a package adhesive film and a cover plate. The cell string includes a plurality of solar cells. The package adhesive film is configured to cover a surface of the cell string. The cover plate is configured to cover a surface of the package adhesive film facing away from the cell string. The solar cell includes a substrate, a tunneling dielectric layer, a doped conductive layer, a passivation layer, and a plurality of electrodes. The tunneling dielectric layer and the doped conductive layer disposed on the substrate. The tunneling dielectric layer is disposed between the doped conductive layer and a surface of the substrate. The doped conductive layer has a doping element of an N type or a P type. The doped conductive layer has a plurality of first heavily doped regions spaced apart from each other and extending in a first direction. A doping concentration in the plurality of first heavily doped regions is greater than a doping concentration in other regions of the doped conductive layer. The passivation layer disposed on a surface of the doped conductive layer facing away from the substrate. The plurality of electrodes spaced apart from each other and extending in a second direction. The plurality of electrodes penetrate the passivation layer to contact the doped conductive layer, and at least two of the plurality of first heavily doped regions are in contact with a same electrode.

BRIEF DESCRIPTION OF THE DRAWINGS

One or more embodiments are described as examples with reference to the corresponding figures in the accompanying drawings, and the examples do not constitute a limitation to the embodiments. The figures in the accompanying drawings do not constitute a proportion limitation unless otherwise stated.

DETAILED DESCRIPTION

As discussed in the background, the photoelectric conversion efficiency of the solar cell with passivating contacts needs to be further improved.

For this purpose, embodiments of the present disclosure provide a solar cell, a method for preparing the solar cell, and a photovoltaic module. In the solar cell, a doped conductive layer has a plurality of first heavily doped regions spaced apart from each other and extending in a first direction, a doping concentration in the plurality of first heavily doped regions is greater than a doping concentration in other regions of the doped conductive layer except the plurality of first heavily doped regions, and at least two of the plurality of first heavily doped regions are in contact with a same electrode. In this way, the doping concentration in the doped conductive layer can improve capability of current transmission, reduce sheet resistance of the doped conductive layer, reduce an open-circuit voltage, and improve photoelectric conversion efficiency. Since the doping concentration in the first heavily doped regions is greater than the doping concentration in the other regions of the doped conductive layer and at least two of the first heavily doped regions are in contact with the same electrode, a good ohmic contact is formed between the first heavily doped regions and the electrodes, thereby reducing a contact resistance between the doped conductive layer and the electrodes and improving the photoelectric conversion efficiency of the solar cell. Meanwhile, the electrodes can be spaced farther from each other to save material for the electrodes, thereby reducing production cost, increasing a light receiving area of a surface of the solar cell, and improving the photoelectric conversion efficiency.

The embodiments of the present disclosure will be described in detail below with reference to the accompanying drawings in order to make the objectives, technical solutions and advantages of the present disclosure clearer. However, those skilled in the art may appreciate that, in the various embodiments of the present disclosure, numerous technical details are set forth in order to provide the reader with a better understanding of the present disclosure. However, the technical solutions claimed in the present disclosure may be implemented without these technical details and various changes and modifications based on the following embodiments.

Figure 1:
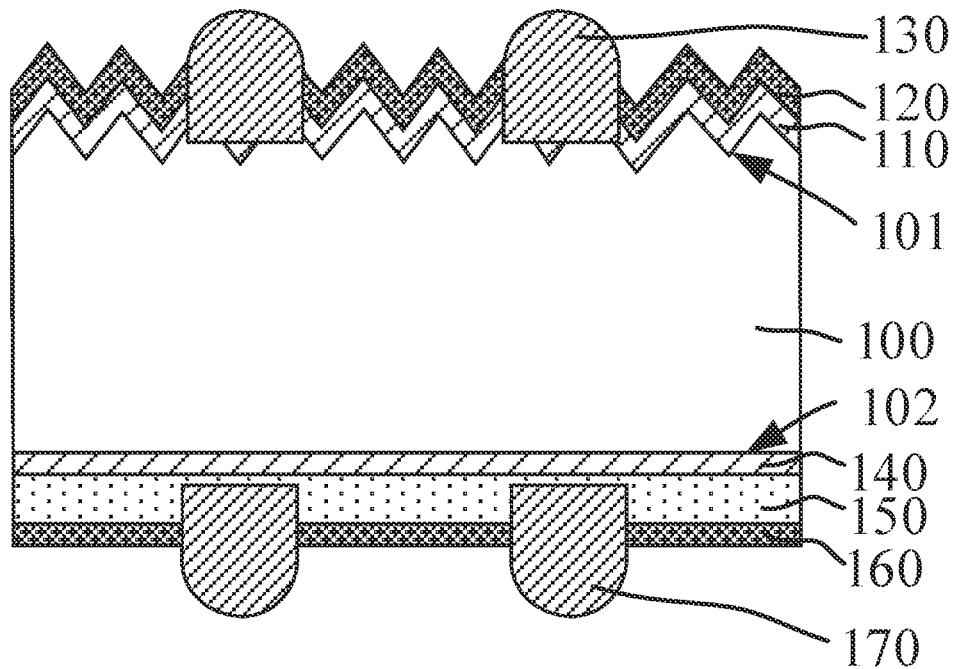
FIG. 1 is a schematic structural diagram of a solar cell according to an embodiment of the present disclosure.
Figure 2:
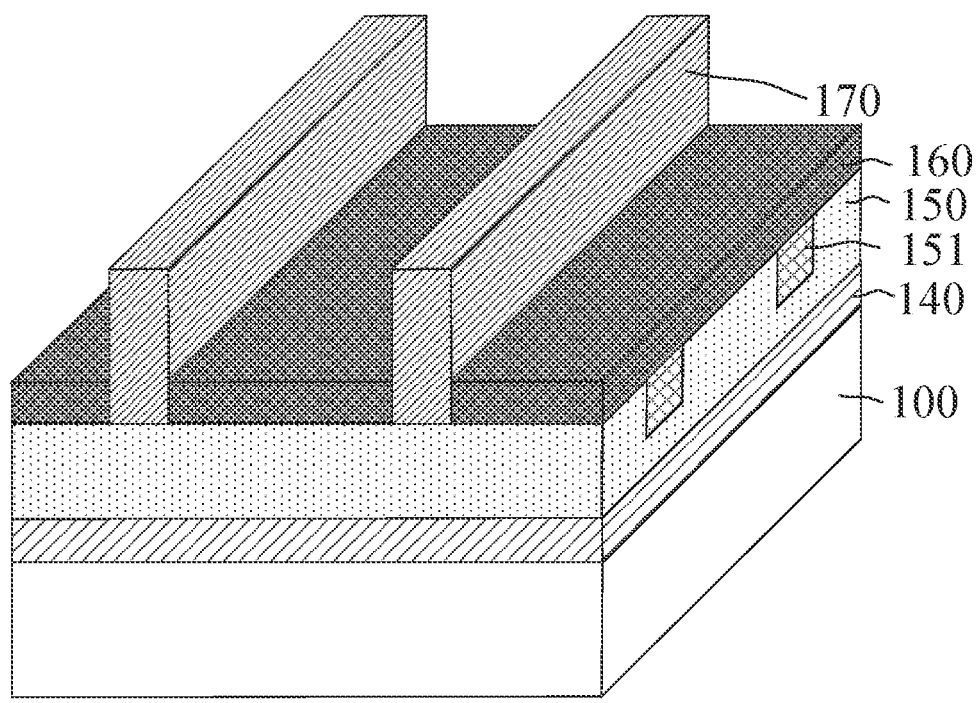
FIG. 2 is a schematic diagram of a local structure of a solar cell according to an embodiment of the present disclosure.
Figure 3:
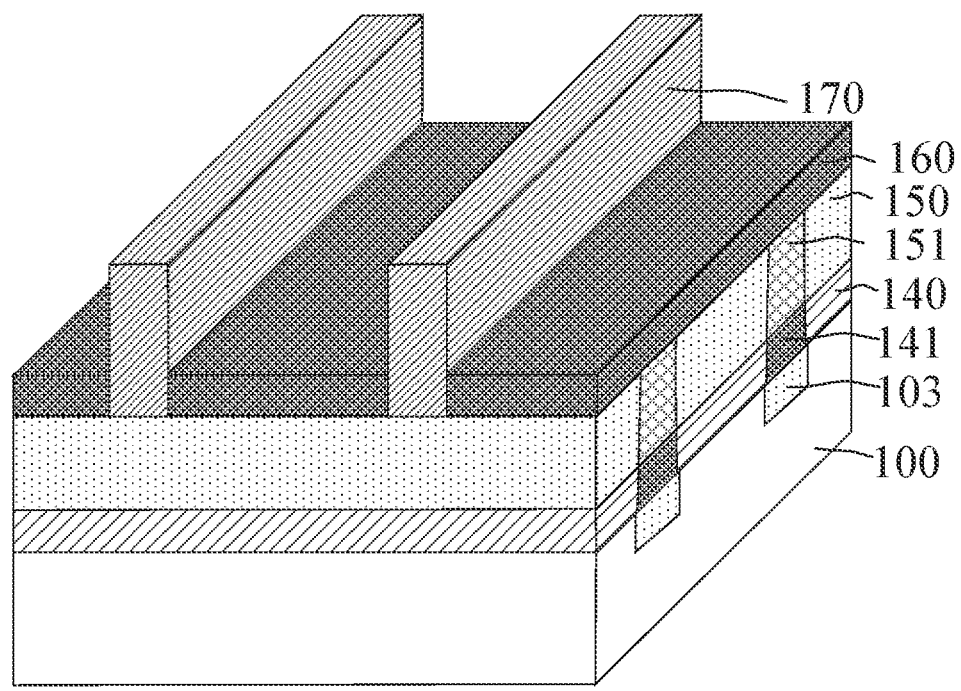
FIG. 3 is a schematic diagram of another local structure of a solar cell according to an embodiment of the present disclosure.
Figure 4:
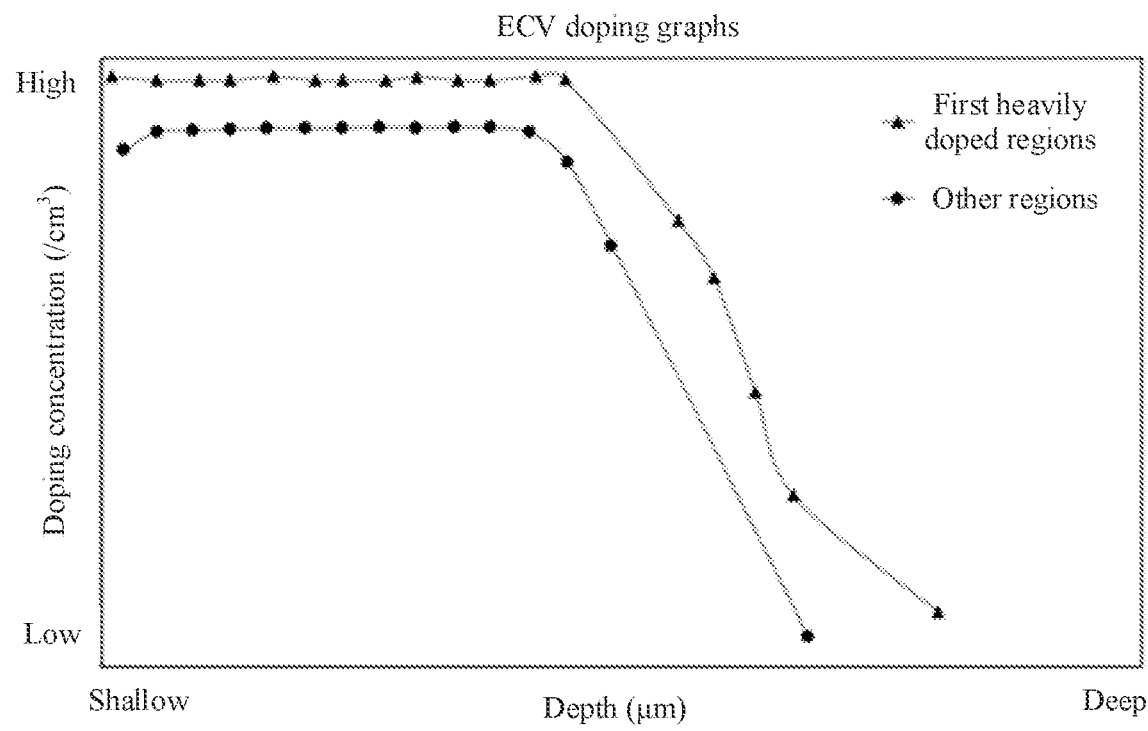
FIG. 4 is a ECV doping graph of a solar cell according to an embodiment of the present disclosure.

Referring to FIGS. 1 to 4, FIG. 1 is a schematic structural diagram of a solar cell according to an embodiment of the present disclosure. FIG. 2 is a schematic diagram of a local structure of a solar cell according to an embodiment of the present disclosure. FIG. 3 is a schematic diagram of another local structure of a solar cell according to an embodiment of the present disclosure. FIG. 4 is a ECV doping graph of a solar cell according to an embodiment of the present disclosure.

In an aspect, the embodiments of the present disclosure provide a solar cell, as shown in FIG. 2, including a substrate 100, a tunneling dielectric layer 140, a doped conductive layer 150, a passivation layer 160, and a plurality of electrodes 170. The tunneling dielectric layer 140 and the doped conductive layer 150 disposed on the substrate 100. The tunneling dielectric layer 140 is disposed between the doped conductive layer 150 and a surface of the substrate 100. The doped conductive layer 150 has a doping element of an N type or a P type. The doped conductive layer 150 has a plurality of first heavily doped regions 151 spaced apart from each other and extending in a first direction. A doping concentration in the plurality of first heavily doped regions 151 is greater than a doping concentration in other regions of the doped conductive layer 150 except the plurality of first heavily doped regions 151. The passivation layer 160 disposed on a surface of the doped conductive layer 150 facing away from the substrate 100. The plurality of electrodes 170 spaced apart from each other and extending in a second direction. The plurality of electrodes 170 each penetrates the passivation layer 160 to contact the doped conductive layer 150, and at least two of the plurality of first heavily doped regions are in contact with a same electrode 170.

In some embodiments, the solar cell is a Tunnel Oxide Passivated Contact (TOPCon) cell, which may be a double-sided TOPCon cell or a single-sided TOPCon cell.

The substrate 100 is configured to absorb incident photons to produce photogenerated carriers. In some embodiments, the substrate 100 is a silicon substrate 100, which may include at least one of single crystal silicon, polysilicon, amorphous silicon and microcrystalline silicon. In other embodiments, the substrate 100 may include materials such as silicon carbide, organic materials, or multinary compounds. The multinary compounds may include, but are not limited to, materials such as perovskite, gallium arsenide, cadmium telluride, copper indium selenium, and the like. For example, substrate 100 in the present disclosure is a single crystal silicon substrate.

In some embodiments, the substrate 100 has a first surface 101 and a second surface 102 opposing to each other. In this case, the first surface 101 of the substrate 100 is referred to as a front surface and the second surface 102 of the substrate 100 is referred to as a rear surface. Further, for a single-sided cell, the first surface 101 of the substrate 100 is a light receiving surface, and the second surface 102 of the substrate 100 is a back surface; for a double-sided cell, both the first surface 101 and the second surface 102 may serve as light receiving surfaces to absorb incident light.

In some embodiments, the substrate 100 has a doping element of an N type or a P type. The N-type element may be a V group element such as a phosphorus (P) element, a bismuth (Bi) element, an antimony (Sb) element or an arsenic (As) element. The P-type element may be a III group element such as a boron (B) element, an aluminum (Al) element, a gallium (Ga) element or an indium (In) element. For example, when being a P-type substrate, the substrate 100 has the doping element of the P type. For another example, when being an N-type substrate, the substrate 100 has the doping element of the N type.

In some embodiments, the substrate 100 and the doped conductive layer 150 have doping elements of a same type. For example, the doping element in the substrate 100 is of the N type, and the doping element in the doped conductive layer 150 is of the N type.

In some embodiments, the solar cell includes an emitter 110 disposed on the first surface 101 of the substrate 100. The substrate 100 forms a PN junction with the emitter 110, for example, an N-type doping element in the substrate 100 and a P-type doping element in the emitter 110. In other embodiments, the emitter 110 may be regarded as a part of, or in other words, an extension of, the substrate 100. Further, a surface of the emitter 110 may be a pyramid-textured surface to reduce light reflection on the surface of the emitter 110, increase light absorption and utilization, and improve conversion efficiency of the solar cell.

In some embodiments, the tunneling dielectric layer 140 and the doped conductive layer 150 are disposed on the second surface 102 of the substrate 100. The tunneling dielectric layer 140 reduces a density of an interface state between the substrate 100 and the doped conductive layer 150 by chemical passivation, reduces minority carriers and hole recombination, and thus is advantageous for reduction of a Jo load current. The tunneling dielectric layer 140 can be configured to tunnel minority carriers into the doped conductive layer 150, and then the minority carriers are transversally transmitted in the doped conductive layer 150 and collected by the electrodes 170, thereby greatly reducing a recombination current caused by contact between the electrode 170 and the doped conductive layer 150, and increasing an open-circuit voltage and a short-circuit current of the solar cell.

In some embodiments, the tunneling dielectric layer 140 may include, but is not limited to, a dielectric material with a tunneling effect, such as silicon oxide, silicon nitride, silicon oxynitride, intrinsic amorphous silicon, and intrinsic polysilicon. The tunneling dielectric layer 140 may have a thickness in a range of 0.5 nm to 2 nm, particularly 0.5 nm to 1.5 nm, and further particularly 0.5 nm to 1.2 nm.

The doping concentration and doping depth of the doped conductive layer 150 affect the photoelectric conversion efficiency of the solar cell. The doping concentration and doping depth of the doped conductive layer 150 are in appropriate ranges to ensure good ohmic contact between the doped conductive layer 150 and the electrode 170 for effective transmission of the minority carriers, that is, a high conversion efficiency of solar cell, and meanwhile to ensure lower composite loss of the surface of the substrate 100 and good interface passivation effect of the tunneling dielectric layer 140 to improve the conversion efficiency of the solar cell.

Methods for detecting impurity concentration distribution may include a spread resistance method, a capacitance-voltage (C-V) method, a secondary ion mass spectrometry (SIMS) method, a differential Hall method, an electrochemical capacitance-voltage (ECV) method, and the like. In some embodiments, the electrochemical capacitance-voltage method is employed for detecting the ranges of the doping concentration and doping depth of the doped conductive layer 150. Referring to FIG. 4, the relationship between the doping concentration and the doping depth of the doped conductive layer 150 in the solar cell of the present disclosure conforms to curves shown in the ECV doping graph of FIG. 4. The curves include a curve for the first heavily doped regions 151 and a curve for the other regions of the doped conductive layer 150. The specific doping concentration and the specific doping depth of the doped conductive layer 150 are not limited herein, as long as the curves shown in FIG. 4 are satisfied.

The doped conductive layer 150 may include at least one of a polycrystalline semiconductor, an amorphous semiconductor and a microcrystalline semiconductor, and particularly, the doped conductive layer includes at least one of a polysilicon layer, an amorphous silicon layer or a microcrystalline silicon layer. The doped conductive layer 150 has a thickness in a range of 40 nm to 150 nm, particularly, 60 nm to 90 nm, which can ensure lower optical loss of the doped conductive layer 150 and good interface passivation effect of the tunneling dielectric layer 140, thereby improving efficiency of the cell. For example, in the present disclosure, the material of the doped conductive layer 150 is polysilicon, and the thickness of the doped conductive layer 150 is 80 nm.

The relationship between the doping concentration and the doping depth of the first heavily doped regions 151 of the doped conductive layer 150 conforms to the curve for the first heavily doped regions 151 as shown in FIG. 4. The specific doping concentration and the specific doping depth of the first heavily doped regions 151 are not limited herein, as long as the curve shown in FIG. 4 is satisfied. Similarly, the relationship between the doping concentration and the doping depth of the other regions of the doped conductive layer 150 conforms to the curve for the other regions.

Further referring to FIGS. 1 to 3, in some embodiments, a ratio of a sum of surface areas of the plurality of first heavily doped regions 151 to a surface area of the doped conductive layer 150 is in a range of 1% to 20%, and optionally, a ratio of a sum of orthographic projection areas of the plurality of first heavily doped regions 151 on the substrate 100 to a orthographic projection area of the doped conductive layer 150 on the substrate 100 is in a range of 1% to 20%, in particular, 5%, 3%, 10%, 15%, or 20%. The ratio in such a range can ensure that the areas of the first heavily doped regions 151 are small enough to avoid excessive optical absorption of the solar cell and thus facilitate improvement of the photoelectric conversion efficiency of the solar cell, and meanwhile, the areas of the first heavily doped regions 151 are large enough to avoid a large sheet resistance of the first heavily doped regions 151 and a small contact area with the electrodes 170, which is conducive to reducing a contact resistance between the doped conductive layer 150 and the electrodes 170, thereby improving the current conductivity and the photoelectric conversion efficiency of the solar cell.

In some embodiments, top surfaces of the first heavily doped regions 151 facing away from the substrate 100 are flush with top surfaces of the other regions of the doped conductive layer 150. In other embodiments, the top surfaces of the first heavily doped regions 151 facing away from the substrate 100 is lower than the top surfaces of the other regions of the doped conductive layer 150 by less than 20% of the thickness of the other regions of the doped conductive layer 150.

In some embodiments, each of the first heavily doped regions 151 has a width in a range of 20 μm to 100 μm in a direction along which the plurality of first heavily doped regions 151 are distributed, particularly, 20 μm, 40 μm, 58 μm, 82 μm or 100 μm. The plurality of first heavily doped regions 151 are spaced apart from each other with a distance in a range of 0.8 mm to 4 mm in a direction along which the plurality of first heavily doped regions 151 are distributed, particularly, 0.8 mm, 1.5 mm, 2.8 mm, 3.6 mm or 4 mm. The widths of the first heavily doped regions 151 and the spaced distances between the first heavily doped regions 151 may further define the ratio of the sum of orthographic projection areas of the plurality of first heavily doped regions 151 on the substrate 100 to the orthographic projection area of the doped conductive layer 150 on the substrate 100 being in a range of 1% to 20%.

In some embodiments, the first heavily doped regions 151 located below different electrodes 170 are disposed at equal intervals such that the first heavily doped regions 151 can uniformly collect current. Optionally, the first heavily doped regions 151 located below a same electrode 170 are disposed at equal intervals so that the first heavily doped regions 151 can uniformly collect current.

In some embodiments, the doping concentration of the plurality of first heavily doped regions is in a range of 2E+20 $cm^{-3}$ to 1E+22 $cm^{-3}$. The doping ion concentration of the other regions of the doped conductive layer 150 is in a range of 1E+20 $cm^{-3}$ to 2E+20 $cm^{-3}$, and the doping ion concentration of the first heavily doped regions 151 is in a range of 2E+20 $cm^{-3}$ to 2E+21 $cm^{-3}$.

It can be understood that the doping elements refer to a certain number and a certain kind of impurities or elements doped into the crystal(s), including electrically active elements and non-electrically active elements, whose concentration is roughly expressed as the "doping concentration." The doping ion concentration in the embodiments of the present disclosure refers to a concentration of electrically active impurities (in ionized state). In this regard, the doping concentration is greater than the doping ion concentration.

Further referring to FIG. 2, in some embodiments, the depth of the first heavily doped region 151 is smaller than or equal to the thickness of the doped conductive layer 150 in a direction perpendicular to the surface 102 of the substrate 100.

In some embodiments, a ratio of the depth of the plurality of first heavily doped regions 151 to the thickness of the doped conductive layer 150 is in a range of 50% to 100%, particularly, 80% to 100%, and further particularly, 80%, 88%, 92% or 100%.

It should be noted that the above description of the embodiments with respect to FIG. 2 takes as an example that the first heavily doped regions 151 do not extend through the doped conductive layer 150 along its thickness. Alternatively, in other embodiments of the present disclosure, the first heavily doped regions 151 may be configured to extend through the doped conductive layer 150 along its thickness, that is, the ratio of the depth of the plurality of first heavily doped regions 151 to the thickness of the doped conductive layer 150 is 100%. Specifically, the following will be described in detail with reference to FIG. 3.

Referring to FIG. 3, the substrate 100 has a plurality of second heavily doped regions 103. A doping concentration in the plurality of second heavily doped regions 103 is greater than a doping concentration in other regions of the substrate 100 except the plurality of second heavily doped regions 103. Each of the plurality of second heavily doped regions 103 is aligned with a respective one of the plurality of first heavily doped regions 151. The plurality of first heavily doped regions 151 and the plurality of second heavily doped regions 103 have doping elements of a same type.

The substrate 100 has the plurality of second heavily doped regions 103, and surfaces of the second heavily doped regions 103 are exposed from the substrate 100. The doping concentration in the second heavily doped regions 103 is greater than the doping concentration in the other regions of the substrate 100, which is conducive to improving transport efficiency for carriers, increasing open-circuit voltage, improving current transmission efficiency and thus the photoelectric conversion efficiency of the solar cell.

In some embodiments, the plurality of second heavily doped regions 103 have a depth in a range of 0.001 μm to 1 μm in a direction perpendicular to the surface of the substrate 100, in particular 0.005 μm, 0.02 μm, 0.09 μm, 0.4 μm or 0.9 μm. This can avoid tunneling effect caused by the high doping concentration in the second heavily doped regions 103, that is, the doping element in the second heavily doped regions 103 does not diffuse into a surface where the substrate 100 is in contact with the emitter 110 or into the emitter 110, so that the open-circuit voltage of the solar cell can be increased and the photoelectric conversion efficiency of the solar cell can be improved.

In some embodiments, in the direction along which the plurality of first heavily doped regions 151 are distributed, the width of each of the plurality of first heavily doped regions 151 is smaller than a width of a respective one of the plurality of second heavily doped regions 130. The doping concentration in the second heavily doped regions 103 is equal to the doping concentration in the first heavily doped regions 151. The doping concentration in the second heavily doped regions 103 is in a range of 1E+20 $cm^{-3}$ to 1E+22 $cm^{-3}$, and the doping ion concentration in the second heavily doped regions 103 is in a range of 1E+20 $cm^{-3}$ to 2E+20 $cm^{-3}$. In other embodiments, the doping concentration in the second heavily doped regions 103 is less than the doping concentration in the first heavily doped regions 151.

In some embodiments, the tunneling dielectric layer 140 has a plurality of third heavily doped regions 141 extending through the tunneling dielectric layer 140 along its thickness to contact the plurality of first heavily doped regions 151 and the plurality of second heavily doped regions 103, respectively. Each of the plurality of third heavily doped regions 141 is aligned with a respective one of the plurality of first heavily doped regions 151 and a respective one of the plurality of second heavily doped regions 103. The plurality of first heavily doped regions 151, the plurality of second heavily doped regions 103 and the plurality of third heavily doped regions 141 have doping elements of a same type. In this way, recombination loss between the tunneling dielectric layer 140 and the substrate 100, and between the tunneling dielectric layer 140 and the doped conductive layer 150 can be reduced, which is conducive to improving transport efficiency for carriers, increasing open-circuit voltage, improving current transmission efficiency and thus the photoelectric conversion efficiency of the solar cell. Specifically, each third heavily doped region 141 has one end contacting a respective first heavily doped region 151, and one other end contacting a respective second heavily doped region 103.

In some embodiments, in the direction along which the plurality of first heavily doped regions 151 are distributed, each second heavily doped region 103 has a width smaller than a width of a respective third heavily doped region 141, and each first heavily doped region 151 has a width equal to the width of a respective third heavily doped region 141. In other embodiments, the width of each second heavily doped region 103 is equal to a width of a respective third heavily doped region 141, and the width of each first heavily doped region 151 is smaller than a width of a respective third heavily doped region 141. In still other embodiments, the width of each third heavily doped region 141 is larger than the width of a respective first heavily doped region 151 and is smaller than the width of a respective second heavily doped region 103. In one example, the width of each first heavily doped region 151 is 50 μm, the width of each third heavily doped region 141 is 60 μm, and the width of each second heavily doped region 103 is 70 μm.

In some embodiments, a doping concentration in the third heavily doped regions 141 is in a range of 6E+19 $cm^{-3}$ to 2E+20 $cm^{-3}$. A doping ion concentration in the third heavily doped regions 141 is in a range of 6E+19 $cm^{-3}$ to 1E+20 $cm^{-3}$. The doping concentration in the third heavily doped regions 141, the doping concentration in the second heavily doped regions 103, and the doping concentration in the first heavily doped regions 151 may be the same. In other embodiments, the doping concentration in the third heavily doped regions 141 is less than the doping concentration in the first heavily doped regions 151, and is more than the doping concentration in the second heavily doped regions 103. For example, the doping concentration in the first heavily doped regions 151 is 4E+20 $cm^{-3}$, the doping concentration in the third heavily doped regions 141 is 3E+20 $cm^{-3}$, and the doping concentration in the second heavily doped regions 103 is 2E+20 $cm^{-3}$.

It will be appreciated that the doping concentration in the first heavily doped regions 151 may be evenly distributed, or may be decreased stepwise or gradually in a direction from the first heavily doped regions 151 to the second heavily doped regions 103. The doping concentration of the second heavily doped regions 103 may be evenly distributed, or may be decreased stepwise or gradually in a direction from the first heavily doped regions 151 to the second heavily doped regions 103. The doping concentration of the third heavily doped regions 141 may be evenly distributed, or may be decreased stepwise or gradually in a direction from the first heavily doped regions 151 to the second heavily doped regions 103.

It should be noted that the doping concentration in the first heavily doped regions 151 of the doped conductive layer 150 of the solar cell shown in FIG. 2 may be the same or different from the doping concentration in the first heavily doped regions 151 of the doped conductive layer 150 of the solar cell shown in FIG. 3, and both are in a range of 2E+20 $cm^{-3}$ to 1E+22 $cm^{-3}$.

Similarly, the widths and the lengths of the first heavily doped regions 151 and the spaced distances between the first heavily doped regions 151 may be set according to different structural requirements, as long as the ratio of the sum of the surface areas of the plurality of first heavily doped regions 151 to the surface area of the doped conductive layer 150 is in a range of 1% to 20%.

Further referring to FIGS. 1 to 3, the passivation layer 160 may reduce the recombination of metal regions caused by the contact of the electrodes 170 with the substrate 100, thereby improving efficiency of the cell. The passivation layer 160 may be of a single layer structure or a stacked layer structure, and may be made from a material including at least one of silicon oxide, silicon nitride, silicon oxynitride, silicon oxycarbonitride, titanium oxide, hafnium oxide and aluminum oxide.

The electrodes 170 are grid lines of a solar cell for collecting and gathering current of the solar cell. The electrodes 170 may be formed by sintering a firing-through paste. The electrodes 170 may locally or fully contact the doped conductive layer 150. The electrodes 170 may be made from a material including at least one of aluminum, silver, gold, nickel, molybdenum and copper. In some embodiments, the electrodes 170 are bottom electrodes or back electrodes when the doped conductive layer 150 is disposed on the rear surface of the substrate 100. In some cases, the electrodes 170 are fine grid lines or finger grid lines to distinguish from main grid lines or bus bars.

The first direction and the second direction may intersect so that at least two first heavily doped regions 151 contact a same electrode 170, and an angle between the first direction and the second direction may be in a range of 0° to 90°, particularly, 90°, that is, the first heavily doped regions 151 extend perpendicularly to the electrodes 170.

In some embodiments, further referring to FIG. 1, the solar cell further includes a first passivation layer 120 disposed on a surface of the emitter 110 facing away from the substrate 100, the first passivation layer 120 being referred to as a front passivation layer, and a plurality of electrodes 130 spaced apart from each other and extending in the second direction, the plurality of electrodes 130 penetrating the first passivation layer 120 to contact the emitter 110.

In some embodiments, the first passivation layer 120 may be of a single layer structure or a stacked layer structure, and the first passivation layer 120 may be made from a material including at least one of silicon oxide, silicon nitride, silicon oxynitride, silicon oxycarbonitride, titanium oxide, hafnium oxide and aluminum oxide.

The electrodes 130 may be formed by sintering a firing-through paste. The electrodes 130 may locally or fully contact the emitter 110. The electrodes 170 may be made from a material including at least one of aluminum, silver, nickel, gold, molybdenum and copper. In some embodiments, electrodes 130 are top electrodes or front electrodes. In some cases, the electrodes 130 are fine grid lines or finger grid lines to distinguish from main grid lines or bus bars.

In the technical solutions of the solar cell provided in the embodiments of the present disclosure, the doped conductive layer 150 has a plurality of first heavily doped regions 151 spaced apart from each other and extending in a first direction, the doping concentration in the plurality of first heavily doped regions 151 is greater than the doping concentration in other regions of the doped conductive layer 150; the plurality of electrodes 170 are spaced apart from each other, and at least two of the plurality of first heavily doped regions 151 are in contact with a same electrode 170. In this way, the doped conductive layer 150 includes the first heavily doped regions 151 and the other regions, that is, the doping concentration and the doping depth of the first heavily doped regions 151 can be appropriately set without affecting the doping concentration and the thickness of the other regions of the doped conductive layer 150. This is conducive to reducing sheet resistance and optical absorption of the doped conductive layer 150, and improving photoelectric conversion efficiency of the solar cell. Since the doped conductive layer 150 has the plurality of first heavily doped regions 151 spaced apart from each other and the doping ion concentration in the first heavily doped regions 151 is greater than the doping ion concentration in the other regions of the doped conductive layer 150, the number of majority carriers in the first heavily doped regions 151 is greater than that in the other regions, which improves capability of current transmission, and thus reduce series resistance of the solar cell and improve the photoelectric conversion efficiency. Since at least two of the first heavily doped regions 151 are in contact with the same electrode 170, a good ohmic contact is formed between the first heavily doped regions 151 with the high doping concentration and the electrodes 170, and a contact resistance between the first heavily doped regions 151 with the high doping concentration and the electrodes 170 is lower than that between the other regions of the doped conductive layer 150 and the electrodes 170, resulting in better current conduction effect and improved photoelectric conversion efficiency.

Figure 5:
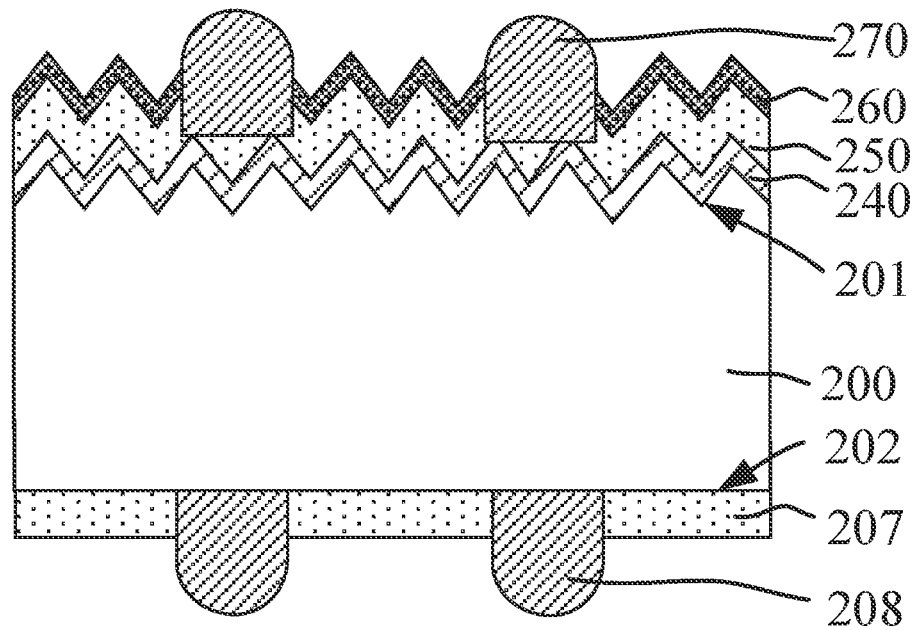
FIG. 5 is a schematic structural diagram of a solar cell according to another embodiment of the present disclosure.

FIG. 5 is a schematic structural diagram of a solar cell according to another embodiment of the present disclosure. The structure of the solar cell shown in FIG. 5 is partly the same as that of the solar cell shown in FIGS. 1 to 3, with the main difference that the tunneling dielectric layer and the doped conductive layer are disposed on the first surface (also referred to as the front surface) of the substrate. Details of the same or similar contents or elements given in the embodiments with respect to FIGS. 1 to 3 will not be repeated hereafter, and merely details for the difference will be described. The solar cell provided in another embodiment of the present disclosure will be described in detail below with reference to FIG. 5.

Referring to FIG. 5, the solar cell includes a substrate 200, a tunneling dielectric layer 240, a doped conductive layer 250, a passivation layer 260 and a plurality of electrodes 270. The substrate 200 has a first surface 201 (also referred to as a front surface 201) and a second surface 202 (also referred to as a rear surface 202) opposing to each other. The tunneling dielectric layer 240 and the doped conductive layer 250 are disposed on the first surface 201 of the substrate 200. The tunneling dielectric layer 240 is disposed between the doped conductive layer 250 and the substrate 200. The passivation layer 260 is disposed on a surface of the doped conductive layer 250 facing away from the substrate 200, and the passivation layer 260 is referred to as a front passivation layer. The plurality of electrodes 270 (also referred to as first electrodes 270) are spaced apart from each other and extend in a second direction. Each electrode 270 penetrates the passivation layer 260 to contact the doped conductive layer 250. The solar cell further includes a second passivation layer 207 disposed on the second surface 202 of the substrate 200 and a plurality of electrodes 208 (also referred to as second electrodes 208) penetrating the second passivation layer 207 to contact the substrate 200. The second passivation layer 207 is referred to as a rear passivation layer.

It will be appreciated that the solar cell shown in FIG. 5 may be a back-junction solar cell, i.e., a PN junction is formed on a rear side of the cell. The doped conductive layer 250 and the substrate 200 have doping elements of a same type. For example, the substrate 200 is an N-type substrate, and the doped conductive layer 250 is doped with N-type elements. For another example, the substrate 200 is a P-type substrate, and the doped conductive layer 250 is doped with P-type elements. An emitter region is formed inside the substrate 200 near the second surface 202 and has a doping element of a type opposite to that of the doping element in the substrate 200.

It will be appreciated that the doped conductive layer 250 is the same as or similar to the doped conductive layer 150 described above with respect to FIGS. 1 to 3. That is, in other embodiments of the present disclosure, the doped conductive layer 250 may have a plurality of first heavily doped regions spaced apart from each other. Similarly, the substrate 200 may have a plurality of second heavily doped regions, and the tunneling dielectric layer 240 may have a plurality of third heavily doped regions.

In some embodiments, the second passivation layer 207 may be of a single layer structure or a stacked layer structure. The second passivation layer 207 may be made from a material including at least one of silicon oxide, silicon nitride, silicon oxynitride, silicon oxycarbonitride, titanium oxide, hafnium oxide and aluminum oxide.

The electrodes 208 may be formed by sintering a firing-through paste. The electrodes 208 may locally or fully contact the substrate 200. The electrodes 208 may be made from a material including at least one of aluminum, silver, nickel, gold, molybdenum and copper.

In some embodiments, the electrodes 270 are top electrodes or front electrodes, and the electrodes 208 are bottom electrodes or back electrodes.

For the solar cell shown in FIG. 5, the tunneling dielectric layer 240 and the doped conductive layer 250 are disposed on the first surface 201 of the substrate 200, and the doped conductive layer 250 has the plurality of first heavily doped regions, thereby reducing sheet resistance and optical absorption of the doped conductive layer 250, and improving photoelectric conversion efficiency of the solar cell. Meanwhile, the two first heavily doped regions contact the same electrode 270, so that a good ohmic contact can be formed, resulting in better current conduction effect and improved photoelectric conversion efficiency. In addition, the tunneling dielectric layer 240 and the doped conductive layer 250 are disposed on the first surface 201 of the substrate 200, thereby reducing probability of recombination of the carriers and holes on the first surface 201 of the substrate 200, and the metal recombination caused by a direct contact between the electrode 270 and the substrate 200, and thus improving the photoelectric conversion efficiency.

The foregoing solar cell discussed with respect to FIG. 1 or FIG. 5 is an example in which a tunneling dielectric layer and a doped conductive layer having heavily doped regions are disposed on a single surface (a first surface or a second surface) of a substrate. In other embodiments of the present disclosure, it is further provided that each of the first surface and the second surface of the substrate is provided with the tunneling dielectric layer and the doped conductive layer disposed thereon, that is, the solar cell is a double-sided TOPCon cell. Details of the same or similar content or elements given in the embodiments of FIGS. 1 to 5 will not be repeated hereafter, and merely details for the difference will be described. The following will be described in detail with reference to FIGS. 6 and 7.

Figure 6:
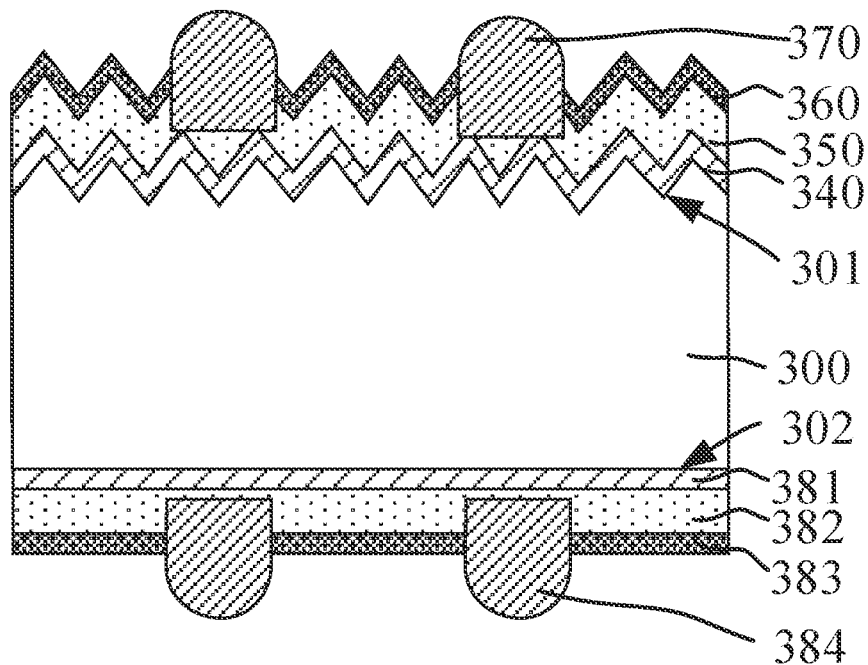
FIG. 6 is a schematic structural diagram of a solar cell according to still another embodiment of the present disclosure.

FIG. 6 is a schematic structural diagram of a solar cell according to still another embodiment of the present disclosure. Referring to FIG. 6, a solar cell includes a substrate 300, a tunneling dielectric layer 340 (also referred to as a first tunneling layer 340), a doped conductive layer 350 (also referred to as a first conductive layer 350), a passivation layer 360 and a plurality of electrodes 370. The substrate 300 has a first surface 301 and a second surface 302 opposing to each other. The tunneling dielectric layer 340 and the doped conductive layer 350 are disposed on the first surface 301 of the substrate 300. The tunneling dielectric layer 340 is disposed between the doped conductive layer 350 and the substrate 300. The passivation layer 360 is disposed on a surface of the doped conductive layer 350 facing away from the substrate 300, and the passivation layer 360 is referred to as a front passivation layer. The plurality of spaced electrodes 370 are spaced apart from each other and extend in a second direction. Each electrode 370 penetrates the passivation layer 360 to contact the doped conductive layer 350. The electrodes 370 are top electrodes or front electrodes. The solar cell further includes, stacked on the second surface 302 of the substrate 300 in sequence, a first tunneling dielectric layer 381, a first doped conductive layer 382, a third passivation layer 383, and a plurality of electrodes 384. The electrodes 384 penetrate the third passivation layer 383 to contact the first doped conductive layer 382. The third passivation layer 383 is referred to as a rear passivation layer, and the electrodes 384 are bottom electrodes or back electrodes.

In some embodiments, the doped conductive layer 350 and the substrate 300 have doping elements of a same type, and the first doped conductive layer 382 has a doping element of a type opposite to that of the doping element in the substrate 300. In one example, the substrate 300 has an N-type doping element, the doped conductive layer 350 has an N-type doping element, and the first doped conductive layer 382 has a P-type doping element. In another example, the substrate 300 has a P-type doping element, the doped conductive layer 350 has a P-type doping element, and the first doped conductive layer 382 has an N-type doping element.

It will be appreciated that the solar cell shown in FIG. 6 may be a back-junction solar cell.

The doped conductive layer 350 is the same as or similar to the doped conductive layer 150 described above with respect to FIGS. 1 to 3. That is, the doped conductive layer 350 may have a plurality of first heavily doped regions spaced apart from each other. Similarly, the substrate 300 may have a plurality of second heavily doped regions, and the tunneling dielectric layer 340 may have a plurality of third heavily doped regions.

In some embodiments, the first tunneling dielectric layer 381 may be made from a material including any one of silicon oxide, silicon nitride, silicon oxynitride, intrinsic amorphous silicon and intrinsic polysilicon. The first tunneling dielectric layer 381 may have a thickness in a range of 0.5 nm to 2 nm, particularly, 0.5 nm to 1.5 nm, and further particularly, 0.5 nm to 1.2 nm. The first doped conductive layer 382 may be made from a material including at least one of polysilicon, amorphous silicon and microcrystalline silicon. The first doped conductive layer 382 has a thickness in a range of 40 nm to 150 nm, and particularly, 60 nm to 90 nm.

In some embodiments, the third passivation layer 383 may be of a single layer structure or a stacked layer structure. The third passivation layer 383 may be made from a material including at least one of silicon nitride, silicon oxynitride, silicon oxycarbonitride, titanium oxide, hafnium oxide, and aluminum oxide.

The electrodes 384 may be formed by sintering a firing-through paste. The electrodes 384 may locally or fully contact the first doped conductive layer 381. The electrodes 384 may be made from a material including at least one of aluminum, silver, nickel, gold, molybdenum and copper.

For the solar cell shown in FIG. 6, the tunneling dielectric layer 340 and the doped conductive layer 350 are disposed on the first surface 301 of the substrate 300, thereby reducing probability of recombination of the carriers and holes on the first surface 301 of the substrate 300, and the metal recombination caused by a direct contact between the electrode 370 and the substrate 300, and thus improving the photoelectric conversion efficiency. The doped conductive layer 350 has the plurality of first heavily doped regions, thereby reducing sheet resistance and optical absorption of the doped conductive layer 350, and improving photoelectric conversion efficiency of the solar cell. Meanwhile, the two first heavily doped regions contact the same electrode 370, so that a good ohmic contact can be formed, resulting in better current conduction effect and improved photoelectric conversion efficiency. Further, the first tunneling dielectric layer 381, the first doped conductive layer 382, the third passivation layer 383, and the electrodes 384 are stacked on the second surface 302 of the substrate 300 in sequence, and the electrodes 384 penetrate the third passivation layer 383 to contact the first doped conductive layer 382. That is, the solar cell is a double-sided TOPcon cell with both the first surface 301 and the second surface 302 of the substrate 300 being light receiving surfaces, which increases the surface area for collecting photogenerated carriers and thus improves the photoelectric conversion efficiency of the solar cell.

Figure 7:
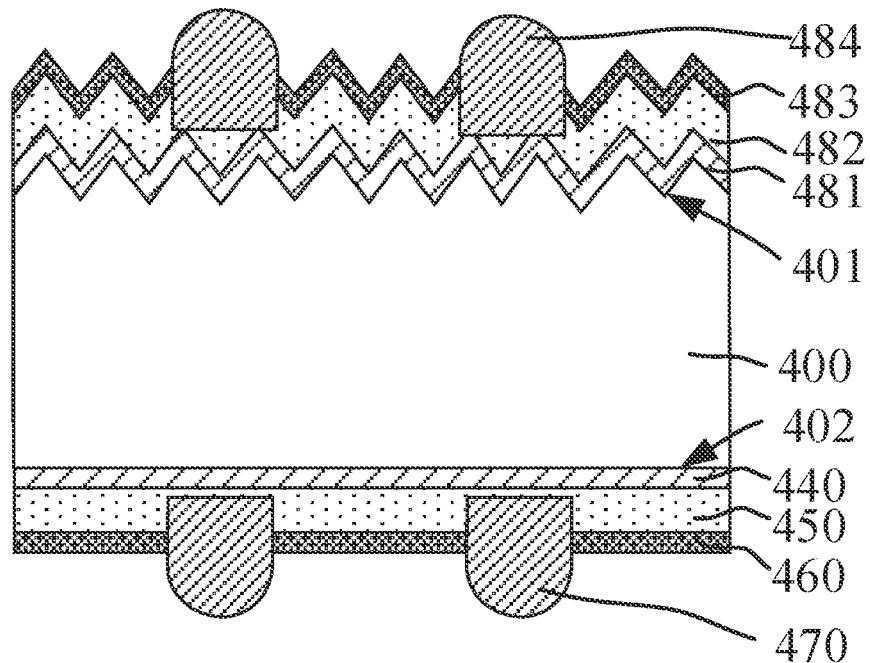
FIG. 7 is a schematic structural diagram of a solar cell according to still another embodiment of the present disclosure.

FIG. 7 is a schematic structural diagram of a solar cell according to still another embodiment of the present disclosure. The structure of the solar cell shown in FIG. 7 is partly the same as that of the solar cell shown in FIG. 6. Details of the same or similar contents or elements given in the above embodiments will not be repeated hereafter, and merely details for the difference will be described.

Referring to FIG. 7, a solar cell includes a substrate 400 having a first surface 401 and a second surface 402 opposing to each other. The solar cell further includes, stacked on the first surface 401 of the substrate 400 in sequence, a first tunneling dielectric layer 481, a first doped conductive layer 482, a third passivation layer 483, and a plurality of electrodes 484. The electrodes 484 penetrate the third passivation layer 483 to contact the first doped conductive layer 482. The third passivation layer 483 is referred to as a front passivation layer, and the electrodes 484 are top electrodes or front electrodes. The solar cell further includes a tunneling dielectric layer 440 (also referred to as a second tunneling layer 440), a doped conductive layer 450 (also referred to as a second conductive layer 450), a passivation layer 460 and a plurality of electrodes 470. The tunneling dielectric layer 440 and the doped conductive layer 450 are disposed on the second surface 402 of the substrate 400. The tunneling dielectric layer 440 is disposed between the doped conductive layer 450 and the substrate 400. The passivation layer 460 is disposed on a surface of the doped conductive layer 450 facing away from the substrate 400, and the passivation layer 460 is referred to as a rear passivation layer. The plurality of spaced electrodes 470 are spaced apart from each other and extend in a second direction. Each electrode 470 penetrates the passivation layer 460 to contact the doped conductive layer 450. The electrodes 470 are bottom electrodes or back electrodes.

The doped conductive layer 450 is the same as or similar to the doped conductive layer 150 described above with respect to FIGS. 1 to 3. That is, the doped conductive layer 450 may have a plurality of first heavily doped regions spaced apart from each other. Similarly, the substrate 400 may have a plurality of second heavily doped regions, and the tunneling dielectric layer 440 may have a plurality of third heavily doped regions.

In some embodiments, the doped conductive layer 450 and the substrate 400 have doping elements of a same type, and the first doped conductive layer 482 has a doping element of a type opposite to that of the doping element in the substrate 400. In one example, the substrate 400 has an N-type doping element, the doped conductive layer 450 has an N-type doping element, and the first doped conductive layer 482 has a P-type doping element. In another example, the substrate 400 has a P-type doping element, the doped conductive layer 450 has a P-type doping element, and the first doped conductive layer 482 has an N-type doping element.

It will be appreciated that the solar cell shown in FIG. 7 may be a front-junction solar cell.

Accordingly, in another aspect, the embodiments of the present disclosure further provide a photovoltaic module for converting received light energy into electrical energy. The photovoltaic module includes a cell string, a package adhesive film and a cover plate. The cell string includes a plurality of solar cells. The package adhesive film is configured to cover a surface of the cell string. The cover plate is configured to cover a surface of the package adhesive film facing away from the cell string. The solar cells are any of the solar cells in the above embodiments described with respect to FIGS. 1 to 7.

The package adhesive film be an organic package adhesive film, such as an ethylene-vinyl acetate copolymer (EVA) adhesive film, or a polyethylene octene co-elastomer (POE) adhesive film. The package adhesive film covers a surface of the cell string for sealing. The cover plate may be a glass cover plate or a plastic cover plate configured to cover a surface of the package adhesive film facing away from the cell string. In some embodiments, a light trapping structure is provided on the cover plate to improve utilization of incident light. The photovoltaic module has a higher ability in current collection and a lower rate in carrier recombination, thereby improving photoelectric conversion efficiency.

Accordingly, in yet another aspect, the embodiments of the present disclosure provide a method for manufacturing the solar cell provided in the foregoing embodiments with respect to FIGS. 1 to 7. Details of the same or similar contents or elements given in the above embodiments will not be repeated hereafter, and merely details for the difference will be described. As an example, the embodiments of the present disclosure provides a method for manufacturing the solar cell as shown in FIGS. 1 to 3.

Referring to FIGS. 4 and 8 to 16, FIGS. 8 to 16 are schematic structural diagrams corresponding to various steps of a method for manufacturing a solar cell according to an embodiment of the present disclosure. Specifically, FIGS. 11 to 14 show merely a local structure, i.e., the structure on the second surface of the substrate of the solar cell.

Figure 8:
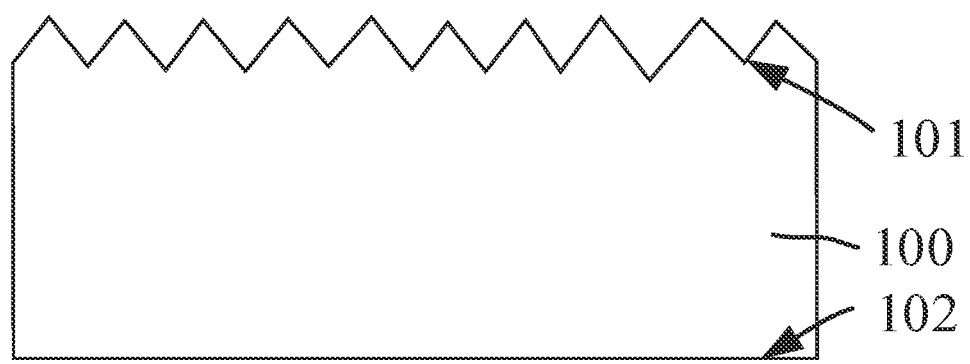
FIGS. 8 to 16 are schematic structural diagrams corresponding to various steps of a method for manufacturing a solar cell according to an embodiment of the present disclosure.

Referring to FIG. 8, a substrate 100 is provided and has a first surface 101 and a second surface 102 opposing to each other.

Figure 9:
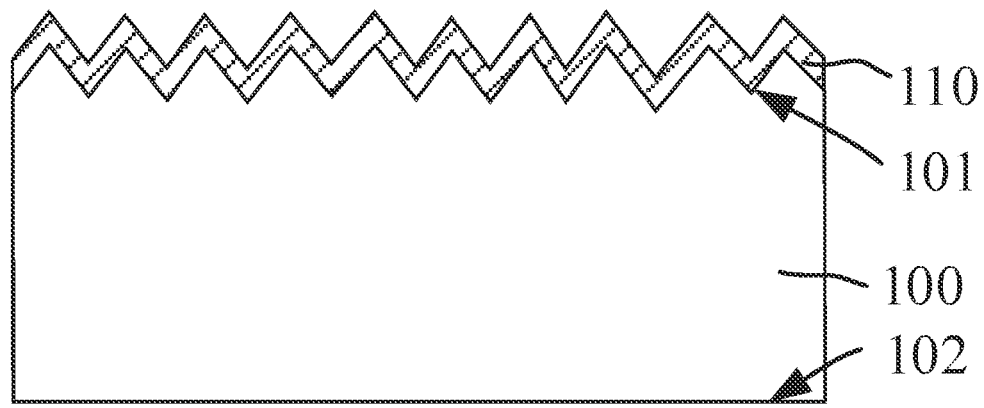

Referring to FIG. 9, an emitter 110 is formed on the first surface 101 of the substrate 100.

Referring to FIGS. 10 to 13, the tunneling dielectric layer 140 and the doped conductive layer 150 are formed. The doped conductive layer 150 is disposed on the second surface 102 of the substrate 100, and the tunneling dielectric layer 140 is disposed between the doped conductive layer 150 and the substrate 100. The doped conductive layer 150 has a plurality of first heavily doped regions 151 spaced apart from each other and extending in a first direction. The first heavily doped regions 151 are exposed from a surface of the doped conductive layer 150 facing away from the substrate 100. A doping concentration in the first heavily doped regions 151 is greater than a doping concentration in other regions of the doped conductive layer 150.

In some embodiments, the tunneling dielectric layer 140 is formed by at least one of a Low Pressure Chemical Vapor Deposition (LPCVD) method and a Plasma Enhanced Chemical Vapor Deposition (PECVD) method.

The steps of forming the doped conductive layer 150 will be described in detail below with reference to FIGS. 11 to 14.

Figure 11:
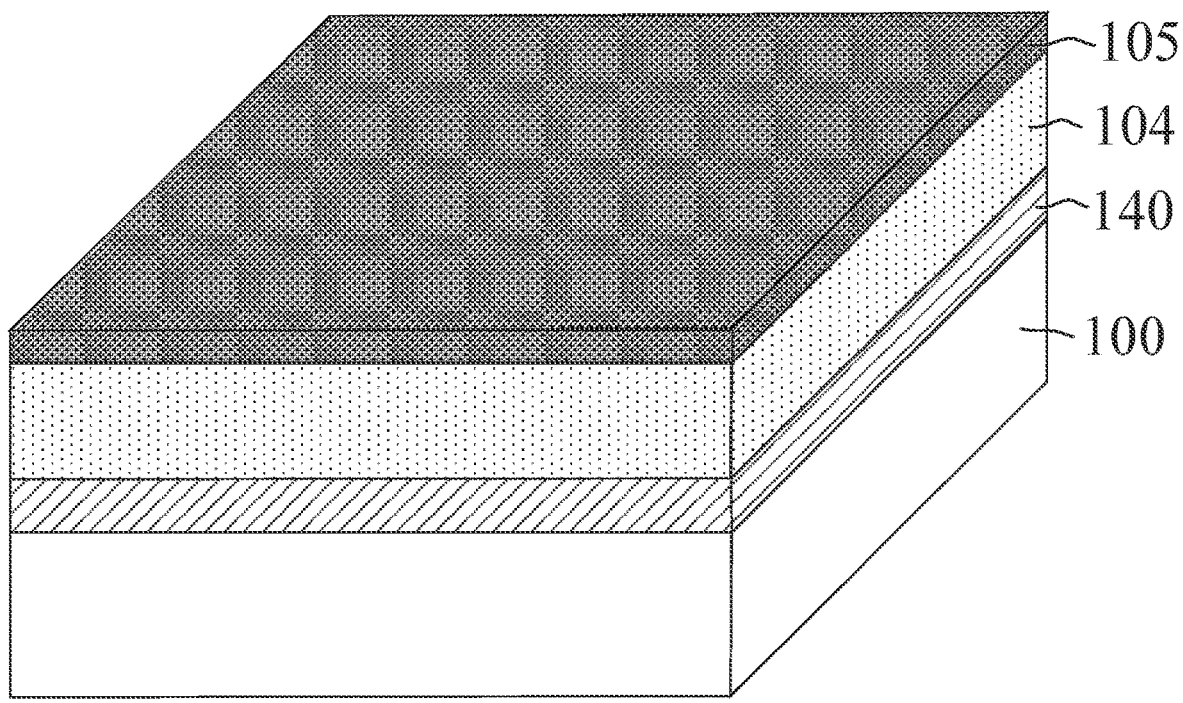

Referring to FIG. 11, an initial doped conductive layer 104 is formed on a surface of the tunneling dielectric layer 140 facing away from the substrate 100 and has a doping element therein.

In some embodiments, the initial doped conductive layer 104 may be formed by performing diffusion or ion implantation on an intrinsic doped conductive layer which is formed by the LPCVD method. The intrinsic doped conductive layer may be an intrinsic polysilicon layer. In other embodiments, the initial doped conductive layer 104 is formed by annealing an initial doped conductive film which may be formed by the PECVD method. The initial conductive film may be made from a material including amorphous silicon or microcrystalline silicon. The initial doped conductive layer 104 may include at least one of a polysilicon layer, an amorphous silicon layer, and a microcrystalline silicon layer. For example, the initial doped conductive layer 104 in the present disclosure includes a polysilicon layer.

In some embodiments, the relationship between the doping concentration and the doping depth of the initial doped conductive layer 104 conforms to the curves shown in the ECV doping graph of FIG. 4. The curves include a curve for the first heavily doped regions and a curve for the other regions of the initial doped conductive layer 104. The specific doping concentration and the specific doping depth of the initial doped conductive layer 104 are not limited herein, as long as the curves shown in FIG. 4 are satisfied.

In some embodiments, the initial doped conductive layer 104 and the substrate 100 may have doping elements of a same type. For example, the doping element in the substrate 100 is of the N type, and the doping element in the initial doped conductive layer 104 is of the N type.

In some embodiments, the initial doped conductive layer 104 has a thickness in a range of 40 nm to 150 nm, and particularly, 60 nm to 90 nm. This can ensure lower optical loss of a doped conductive layer formed subsequently and good interface passivation effect of the tunneling dielectric layer 140, thereby improving efficiency of the cell. The initial doped conductive layer 104 may have the thickness, but is not limited to, in a range of 40 nm to 150 nm, or may be other thicknesses known to those skilled in the art.

Figure 12:
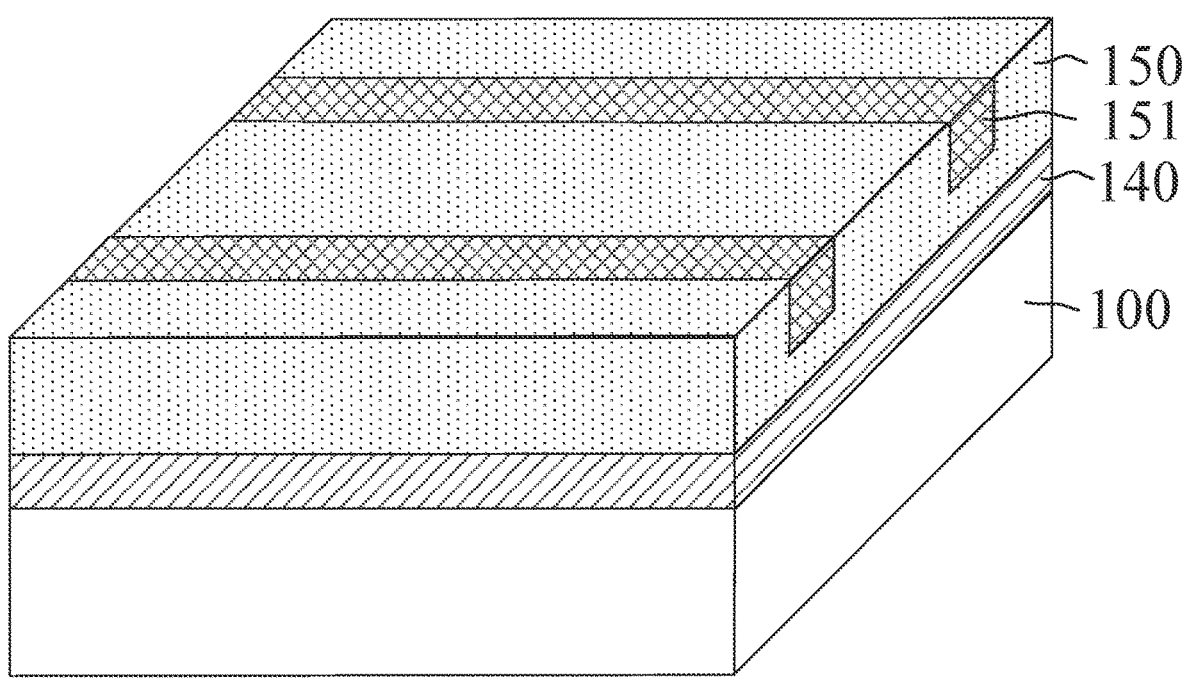

Referring to FIGS. 11 and 12, a doping process is performed on local regions of the initial doped conductive layer 104 for increasing the concentration of doping element in the local regions to form first heavily doped regions 151. In this way, a doped conductive layer 150 is formed.

It can be understood that the doping elements in the doping process refer to a certain number and a certain kind of impurities or elements doped into the crystal(s), including electrically active elements and non-electrically active elements, whose concentration is roughly expressed as the "doping concentration." The doping ion concentration in the embodiments of the present disclosure refers to a concentration of electrically active impurities (in ionized state). In this regard, the doping concentration is greater than the doping ion concentration.

Specifically, referring to FIG. 11, a doping source layer 105 having doping elements therein is formed on a surface of the initial doped conductive layer 104.

In some embodiments, the doping source layer 105 covers entirely the surface of the initial doped conductive layer 104. The doping source layer 105 may be made from a material including, but is not limited to, phosphosilicate glass (PSG) or borophosphosilicate glass (BPSG).

Referring to FIG. 12, a diffusion process is performed to diffuse doping ions in local regions of the doping source layer 105 (refer to FIG. 10) into the initial doped conductive layer 104 to form the first heavily doped regions 151. The doping source layer 105 is then removed.

In some embodiments, the diffusion process is performed locally by using a laser process. The doping source layer 105 is completely removed by wet etching, so as to prevent the silicon wafer from getting damped in the air caused by residual phosphor-silicate glass to lower the current and power. It is also possible to prevent the passivation layer subsequently formed in the doped conductive layer 150 from detaching therefrom, thereby improving the photoelectric conversion efficiency of the solar cell. The solution for the wet etching is a mixture liquid of HNO3 and HF. In other embodiments, the diffusion process may be performed using a thermal diffusion process or an ion implantation process.

It should be noted that the foregoing description with respect to FIGS. 11 and 12 is an example in which the doping source layer 105 covers entirely the surface of the initial doped conductive layer 104. In other embodiments of the present disclosure, a plurality of doping source sub-layers spaced apart from each other may be formed. Specifically, the following will be described in detail with reference to FIG. 13.

Figure 13:
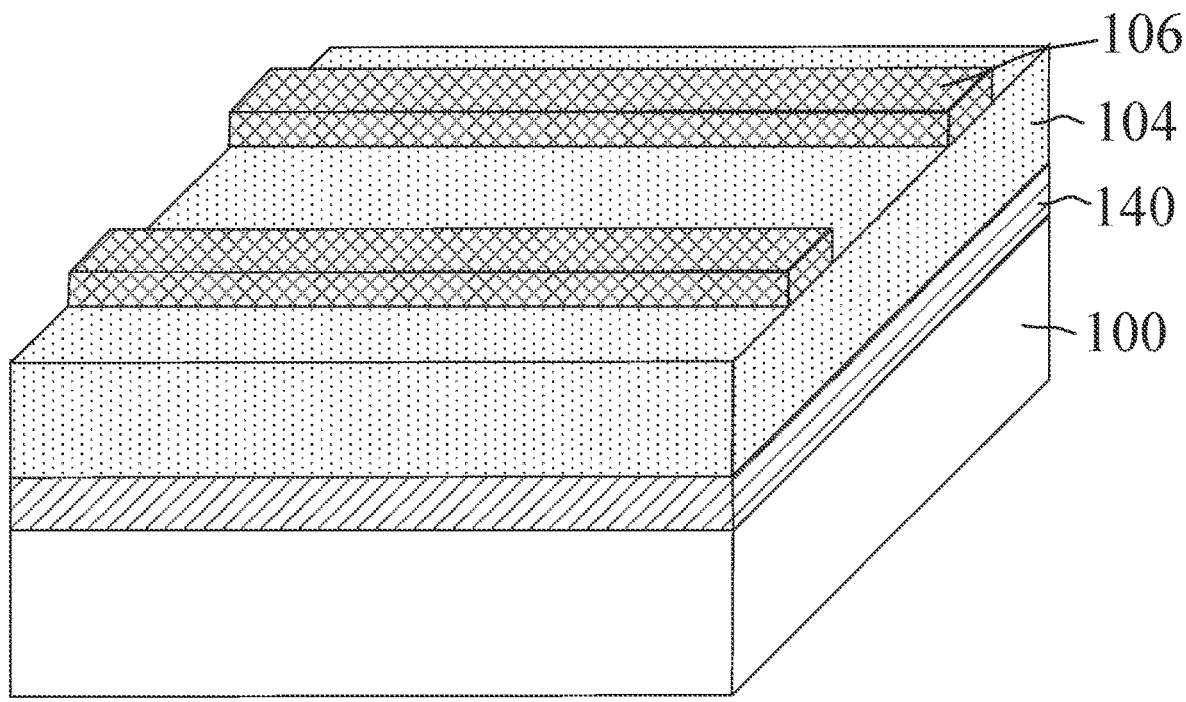

Referring to FIG. 13, a plurality of doping source sub-layers 106 are formed on the surface of the initial doped conductive layer 104. The doping source sub-layers 106 are spaced apart from each other and extend in a first direction.

In some embodiments, a ratio of a sum of surface areas of the doping source sub-layers 106 to a surface area of the initial doped conductive layer 104 is in a range of 1% to 20%. Specifically, a ratio of a sum of orthographic projection areas of the doping source sub-layers 106 on the substrate 100 to an orthographic projection area of the initial doped conductive layer 106 on the substrate 100 is in a range of 1% to 20%, and particularly, 5%, 3%, 10%, 15%, or 20%. The ratio in such a range can ensure that the areas of the first heavily doped regions formed subsequently are small enough to avoid excessive optical absorption of the solar cell and thus facilitate improvement of the photoelectric conversion efficiency of the solar cell, and meanwhile, the areas of the first heavily doped regions are large enough to avoid a large sheet resistance of the first heavily doped regions and a small contact area with electrodes formed subsequently, which is conducive to reducing a contact resistance between the doped conductive layer and the electrodes, thereby improving the current conductivity and the photoelectric conversion efficiency of the solar cell.

In some embodiments, the doping source sub-layers 106 located below different electrodes formed subsequently are disposed at equal intervals such that the first heavily doped regions formed subsequently can uniformly collect current. Optionally, the doping source sub-layers 106 located below a same electrode formed subsequently are disposed at equal intervals so that the first heavily doped regions formed subsequently can uniformly collect current.

In some embodiments, each of the doping source sub-layers 106 has a width in a range of 20 μm to 100 μm in a direction along which the plurality of doping source sub-layers 106 are distributed, particularly, 20 μm, 40 μm, 58 μm, 82 μm or 100 μm. The plurality of doping source sub-layers 106 are spaced apart from each other with a distance in a range of 0.8 mm to 4 mm in a direction along which the plurality of doping source sub-layers 106 are distributed, particularly, 0.8 mm, 1.5 mm, 2.8 mm, 3.6 mm or 4 mm. The widths of the doping source sub-layers 106 and the spaced distances between the doping source sub-layers 106 may further define the ratio of the sum of surface areas of the first heavily doped regions formed subsequently to the surface area of the doped conductive layer being in a range of 1% to 20%.

In some embodiments, the doping source sub-layers 106 may be made from a material including, but is not limited to, phosphosilicate glass or borophosphosilicate glass.

Further referring to FIG. 12, a diffusion process is performed to diffuse doping ions in the doping source sub-layers 106 (refer to FIG. 13) into the initial doped conductive layer 104 to form the first heavily doped regions 151. The doping source sub-layers 106 are then removed.

It will be understood that the doping process may cause the top surface the initial doped conductive layer 104 facing away from the substrate 100 to be etched to a certain extent, that is, the top surfaces of the first heavily doped regions 151 facing away from the substrate 100 is lower than those of the other regions of the doped conductive layer 150 by less than 20% of the thickness of the other regions of the doped conductive layer 150. Alternatively, the top surfaces of the first heavily doped regions 151 facing away from the substrate 100 is flush with the top surfaces of the other regions of the doped conductive layer 150.

Figure 14:
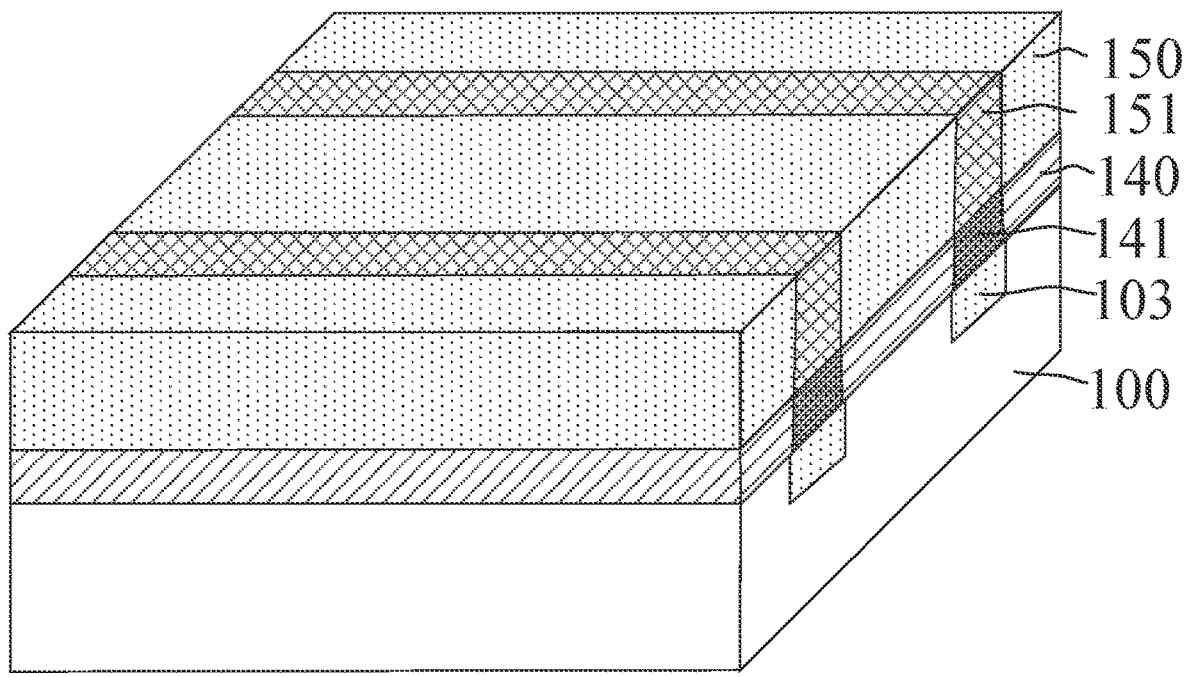

In other embodiments, referring to FIG. 14, a diffusion process is performed to diffuse doping elements in local regions of the doping source layer 105 (refer to FIG. 11) into the initial doped conductive layer 104 to form the first heavily doped regions 151, and the doping elements are further diffused into the tunneling dielectric layer 140 to form third heavily doped regions 141 each aligned with a respective first heavily doped region 151, and into the substrate 100 of a certain thickness to form second heavily doped regions 103 each aligned with a respective first heavily doped region 151 and. The doping source layer 105 is the removed.

In some embodiments, the first heavily doped regions 151 extend through the doped conductive layer 150 along its thickness, that is, the ratio of the depth of the first heavily doped regions 151 to the thickness of the doped conductive layer 150 is 100%.

It should be noted that the doping concentration of the first heavily doped regions 151 of the solar cell shown in FIG. 12 may be the same as or different from the doping concentration of the first heavily doped regions 151 of the solar cell shown in FIG. 14, and both are in a range of 2E+20 $cm^{-3}$ to 1E+22 $cm^{-3}$.

Similarly, the widths and lengths of the first heavily doped regions 151 and the distances between the first heavily doped regions 151 may be set according to different structural requirements, as long as the ratio of the sum of the surface areas of the plurality of first heavily doped regions 151 to the surface area of the doped conductive layer 150 is in a range of 1% to 20%.

The solar cells of FIGS. 12 and 14 may be formed using a nanosecond laser with a laser wavelength of 532 nm or other laser that can achieve doping, and the process parameters of the diffusion process for forming the solar cells of FIGS. 12 and 14 may be different. In some embodiments, the process parameters for forming the solar cell shown in FIG. 12 include a laser power of 5 W to 40W and a laser frequency of 50 KHz to 250 KHz. The process parameters for forming the solar cell shown in FIG. 14 include a laser power of 40 W to 100 W and a laser frequency of 250 KHz to 450 KHz.

Figure 15:
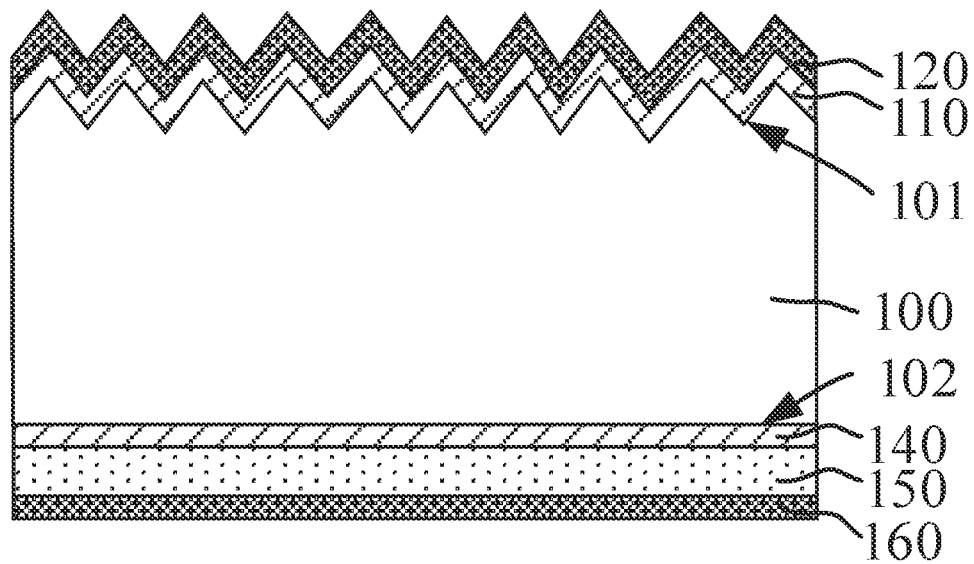

Referring to FIG. 15, a passivation layer 160 is formed on a surface of the doped conductive layer 150 facing away from the substrate 100.

Further referring to FIG. 15, a first passivation layer 120 is formed on a surface of the emitter 110 facing away from the substrate 100.

Figure 16:
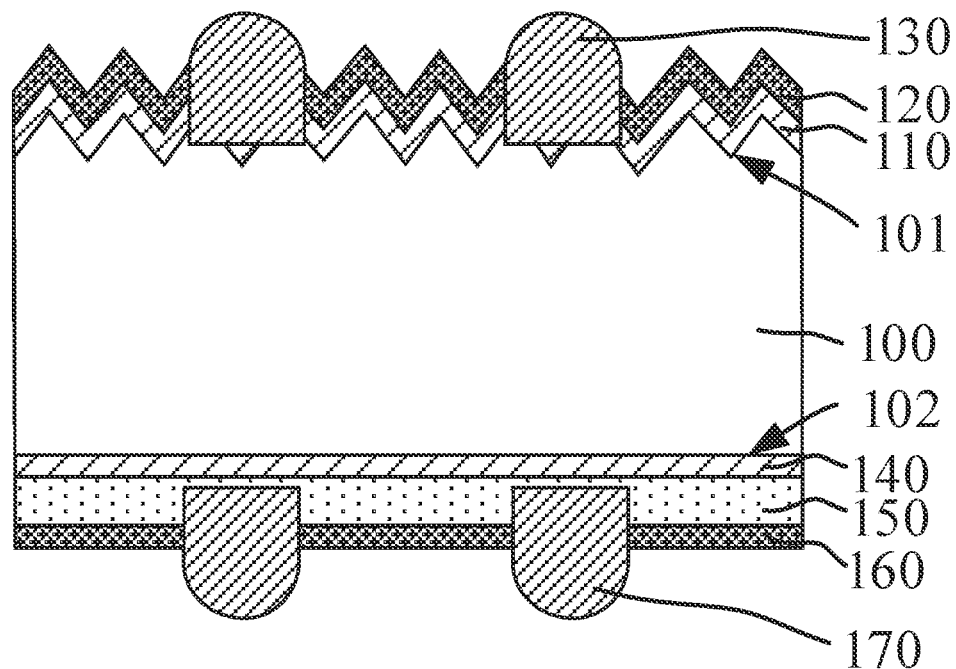

Referring to FIG. 16, a plurality of electrodes 170 are formed. The electrodes 170 are spaced apart from each other and extend in a second direction. Each of the electrodes 170 penetrates the passivation layer 160 to contact the doped conductive layer 150, and at least two first heavily doped regions 151 are in contact with a same electrode 170.

Further referring to FIG. 18, a plurality of electrodes 130 are formed. The electrodes 130 are spaced apart from each other and extend in a second direction. Each of the electrodes 130 penetrates the first passivation layer 120 to contact the emitter 110.

In other embodiments, a method for manufacturing a solar cell is provided to form a solar cell as shown in FIG. 5. The method includes: providing a substrate 200 having a first surface 201 and a second surface 202 opposing to each other; forming, sequentially stacked on the first surface 201, a tunneling dielectric layer 240, a doped conductive layer 250, a passivation layer 260 and a plurality of electrodes 270, the plurality of electrodes 270 being spaced apart from each other and penetrating the passivation layer 260 to contact the doped conductive layer 250; forming, sequentially stacked on the second surface 202, a second passivation layer 207 and a plurality of electrodes 208, the plurality of electrodes 208 penetrating the second passivation layer 207 to contact the substrate 200.

It will be understood that the process step of forming the second passivation layer 207 is the same as or similar to the process step of forming the first passivation layer 120 (as shown in FIG. 15) in the above-described embodiments, and details thereof will not be described hereafter. Similarly, the process step of forming the electrodes 208 is the same as or similar to the process step of forming the electrodes 130 (as shown in FIG. 16) of the above-described embodiments.

In still other embodiments, a method for manufacturing a solar cell is provided to form a solar cell as shown in FIG. 6. The method includes: providing a substrate 300 having a first surface 301 and a second surface 302 opposing to each other; forming, sequentially stacked on the first surface 301, a tunneling dielectric layer 340, a doped conductive layer 350, a passivation layer 360, and a plurality of electrodes 370, the plurality of electrodes 370 being spaced apart from each other and penetrating the passivation layer 360 to contact the doped conductive layer 350; forming, sequentially stacked on the second surface 302, a first tunneling dielectric layer 381, a first doped conductive layer 382, a third passivation layer 383 and a plurality of electrodes 384, the plurality of electrodes 384 penetrating the third passivation layer 383 to contact the first doped conductive layer 382.

Figure 10:
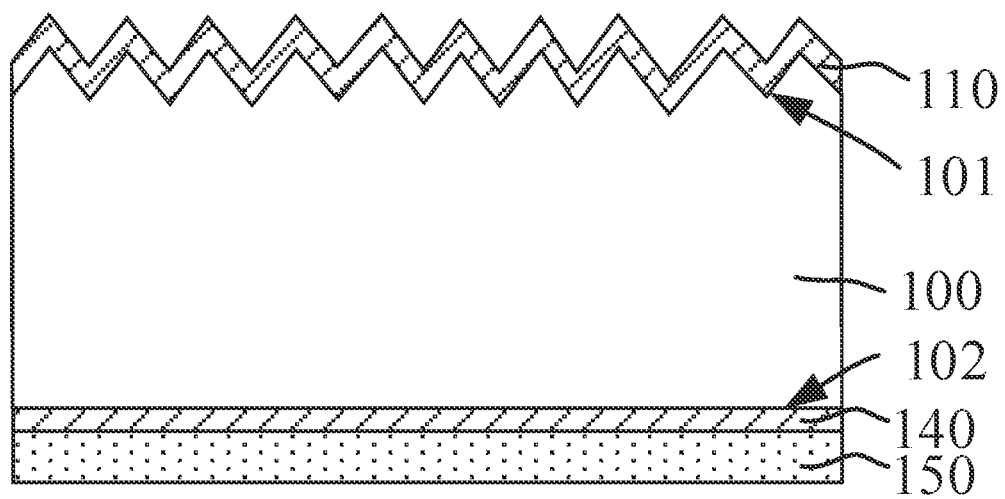

It will be understood that the process step of forming the first tunneling dielectric layer 381 is the same as or similar to the process step of forming the tunneling dielectric layer 140 (as shown in FIG. 10) in the above-described embodiments, and details thereof will not be described hereafter. Similarly, the process step of forming the first doped conductive layer 382 is the same as or similar to the process step of forming the doped conductive layer 150 (as shown in FIG. 10) of the above-described embodiments. The process step of forming the third passivation layer 383 is the same as or similar to the process step of forming the passivation layer 160 (as shown in FIG. 15) of the above-described embodiments. The process step of forming the electrodes 384 is the same as or similar to the process step of forming the electrodes 170 (as shown in FIG. 15) of the above-described embodiments.

In still other embodiments, a method for manufacturing a solar cell is provided to form a solar cell as shown in FIG. 7. The method includes: providing a substrate 400 having a first surface 401 and a second surface 402 opposing to each other; forming, sequentially stacked on the first surface 401, a first tunneling dielectric layer 481, a first doped conductive layer 482, a third passivation layer 483, and a plurality of electrodes 484, the plurality of electrodes 484 penetrating the third passivation layer 483 to contact the first doped conductive layer 482; forming, sequentially stacked on the second surface 402, a tunneling dielectric layer 440, a doped conductive layer 450, a passivation layer 460, and a plurality of electrodes 470, the plurality of electrodes 470 being spaced apart from each other and penetrating the passivation layer 460 to contact the doped conductive layer 450.

Those skilled in the art should appreciate that the aforementioned embodiments are specific embodiments for implementing the present disclosure. In practice, however, various changes may be made in the forms and details of the specific embodiments without departing from the spirit and scope of the present disclosure. Any person skilled in the art may make their own changes and modifications without departing from the spirit and scope of the present disclosure, so the protection scope of the present disclosure shall be subject to the scope defined by the claims.

What is claimed is:
1. A solar cell, comprising:
a substrate;
a tunneling dielectric layer and a doped conductive layer disposed on the substrate, wherein the tunneling dielectric layer is disposed between the doped conductive layer and a surface of the substrate, the doped conductive layer has a plurality of first heavily doped regions spaced apart from each other and each extending in a first direction, and a doping concentration in the plurality of first heavily doped regions is greater than a doping concentration in other regions of the doped conductive layer;
a passivation layer disposed on a surface of the doped conductive layer facing away from the substrate; and
a plurality of electrodes extending in a second direction and spaced apart from each other, wherein the plurality of electrodes penetrate the passivation layer to contact the doped conductive layer, and at least two of the plurality of first heavily doped regions are in contact with a same electrode, wherein
the substrate has a plurality of second heavily doped regions, each of the plurality of second heavily doped regions is aligned with a respective one of the plurality of first heavily doped regions, and the plurality of first heavily doped regions and the plurality of second heavily doped regions having doping elements of a same type; wherein a doping concentration in the plurality of second heavily doped regions is greater than a doping concentration in other regions of the substrate; and
the tunneling dielectric layer has a plurality of third heavily doped regions, each of the plurality of third heavily doped regions is aligned and in contact with a respective one of the plurality of first heavily doped regions and extends through the tunneling dielectric layer along a thickness direction of the tunneling dielectric layer to contact a respective one the plurality of second heavily doped regions, and the plurality of first heavily doped regions and the plurality of third heavily doped regions have doping elements of a same type.

2. The solar cell according to claim 1, wherein the plurality of first heavily doped regions each have a depth in a direction perpendicular to the surface of the substrate that is smaller than or equal to a thickness of the doped conductive layer in a direction perpendicular to the surface of the substrate.

3. The solar cell according to claim 2, wherein a ratio of the depth of each of the plurality of first heavily doped regions to the thickness of the doped conductive layer is in a range of 80% to 100%.

4. The solar cell according to claim 1, wherein a thickness of the doped conductive layer is in a range of 40 nm to 150 nm.

5. The solar cell according to claim 1, wherein a doping concentration in the plurality of second heavily doped regions is less than or equal to the doping concentration in the plurality of first heavily doped regions.

6. The solar cell according to claim 1, wherein the doping concentration in the plurality of first heavily doped regions is in a range of $2E+20$ $cm^{-3}$ to $1E+22$ $cm^{-3}$, a doping concentration in the plurality of second heavily doped regions is in a range of $1E+20$ $cm^{-3}\sim 1E+22$ $cm^{-3}$, and a doping concentration in the plurality of third heavily doped regions is in a range of $6E+19$ $cm^{-3}$ to $2E+20$ $cm^{-3}$.

7. The solar cell according to claim 1, wherein the plurality of second heavily doped regions each have a depth in a range of 0.001 μm to 1 μm in a direction perpendicular to the surface of the substrate.

8. The solar cell according to claim 1, wherein in a direction along which the plurality of first heavily doped regions are distributed, each of the plurality of first heavily doped regions has a width less than a width of a respective one of the plurality of second heavily doped regions, and smaller than or equal to a width of a respective one of the plurality of third heavily doped regions.

9. The solar cell according to claim 1, wherein a ratio of a sum of surface areas of the plurality of first heavily doped regions to a surface area of the doped conductive layer is in a range of 1% to 20%.

10. The solar cell according to claim 1, wherein each of the plurality of first heavily doped regions has a width in a range of 20 μm to 100 μm in a direction along which the plurality of first heavily doped regions are distributed.

11. The solar cell according to claim 1, wherein the plurality of first heavily doped regions are spaced apart from each other with a distance in a range of 0.8 mm to 4 mm in a direction along which the plurality of first heavily doped regions are distributed.

12. The solar cell according to claim 1, wherein the doped conductive layer includes at least one of a polysilicon layer, an amorphous silicon layer, and a microcrystalline silicon layer.

13. The solar cell according to claim 1, wherein the substrate has a first surface and a second surface opposing to each other, and the tunneling dielectric layer and the doped conductive layer are disposed on at least one of the first surface and the second surface of the substrate.

14. The solar cell according to claim 1, wherein the substrate and the doped conductive layer have doping elements of a same type.

15. The solar cell according to claim 1, wherein in the doped conductive layer, the plurality of first heavily doped regions and the other regions of the doped conductive layer have doping elements of a same type.

16. A photovoltaic module, comprising:
a cell string including a plurality of solar cells;
a package adhesive film configured to cover a surface of the cell string;
a cover plate configured to cover a surface of the package adhesive film facing away from the cell string;
wherein each solar cell of the plurality of solar cells includes:
a substrate;
a tunneling dielectric layer and a doped conductive layer disposed on the substrate, wherein the tunneling dielectric layer is disposed between the doped conductive layer and a surface of the substrate, the doped conductive layer has a plurality of first heavily doped regions spaced apart from each other and each extending in a first direction, and a doping concentration in the plurality of first heavily doped regions is greater than a doping concentration in other regions of the doped conductive layer;
a passivation layer disposed on a surface of the doped conductive layer facing away from the substrate; and
a plurality of electrodes extending in a second direction and spaced apart from each other, wherein the plurality of electrodes penetrate the passivation layer to contact the doped conductive layer, and at least two of the plurality of first heavily doped regions are in contact with a same electrode, wherein
the substrate has a plurality of second heavily doped regions, each of the plurality of second heavily doped regions is aligned with a respective one of the plurality of first heavily doped regions, and the plurality of first heavily doped regions and the plurality of second heavily doped regions having doping elements of a same type; wherein a doping concentration in the plurality of second heavily doped regions is greater than a doping concentration in other regions of the substrate; and the tunneling dielectric layer has a plurality of third heavily doped regions, each of the plurality of third heavily doped regions is aligned and in contact with a respective one of the plurality of first heavily doped regions and extends through the tunneling dielectric layer along a thickness direction of the tunneling dielectric layer to contact a respective one the plurality of second heavily doped regions, and the plurality of first heavily doped regions and the plurality of third heavily doped regions have doping elements of a same type.

17. The photovoltaic module according to claim 16, wherein the plurality of first heavily doped regions each have a depth in a direction perpendicular to the surface of the substrate that is smaller than or equal to a thickness of the doped conductive layer in a direction perpendicular to the surface of the substrate.

18. The photovoltaic module according to claim 17, wherein a ratio of the depth of each of the plurality of first heavily doped regions to the thickness of the doped conductive layer is in a range of 80% to 100%.

19. The photovoltaic module according to claim 16, wherein a thickness of the doped conductive layer is in a range of 40 nm to 150 nm.

* * * * *